(12) United States Patent
Wen et al.

(10) Patent No.: US 11,362,233 B2
(45) Date of Patent: Jun. 14, 2022

(54) ELECTRICAL READOUT OPTICAL SENSOR

(71) Applicant: JINAN UNIVERSITY, Guangzhou (CN)

(72) Inventors: Long Wen, Guangzhou (CN); Qin Chen, Guangzhou (CN); Baojun Li, Guangzhou (CN)

(73) Assignee: JINAN UNIVERSITY, Guangzhou (CN)

( * ) Notice: Subject to any disclaimer, the term of this patent is extended or adjusted under 35 U.S.C. 154(b) by 6 days.

(21) Appl. No.: 16/965,305

(22) PCT Filed: Nov. 9, 2018

(86) PCT No.: PCT/CN2018/114869
§ 371 (c)(1),
(2) Date: Jul. 28, 2020

(87) PCT Pub. No.: WO2020/062468
PCT Pub. Date: Apr. 2, 2020

(65) Prior Publication Data
US 2021/0119072 A1  Apr. 22, 2021

(30) Foreign Application Priority Data
Sep. 28, 2018 (CN) .......................... 201811138819.9

(51) Int. Cl.
*H01L 31/10* (2006.01)
*H01L 31/108* (2006.01)
(Continued)

(52) U.S. Cl.
CPC .... *H01L 31/1085* (2013.01); *H01L 31/02327* (2013.01); *H01L 31/022408* (2013.01)

(58) Field of Classification Search
CPC ...................... H01L 31/1085; H01L 31/02327
See application file for complete search history.

(56) References Cited

U.S. PATENT DOCUMENTS

| | | |
|---|---|---|
| 6,423,980 B1 | 7/2002 | Wilson et al. |
| 2008/0153199 A1 | 6/2008 | Kiesel et al. |

(Continued)

FOREIGN PATENT DOCUMENTS

CN        104332510 A        2/2015

OTHER PUBLICATIONS

CN 111063752A, published Apr. 24, 2020.*

(Continued)

*Primary Examiner* — Suberr L Chi
(74) *Attorney, Agent, or Firm* — Bayramoglu Law Offices LLC (57) ABSTRACT

An electrical readout optical sensor, includes a back metal electrode layer, a semiconductor layer, and a metal or metalloid layer; wherein the semiconductor layer is a main body portion and is divided into a first surface and a second surface; the first surface is provided with a groove structure, and forms a grating; the back metal electrode layer covers the second surface of the semiconductor layer; the metal or metalloid layer covers the first surface of the semiconductor layer, and forms a phototube for generating a photocurrent signal having a wide wavelength range and high linearity. An optical sensing structure of narrowband light absorption and a photoelectric conversion structure having a wide wavelength range are directly integrated, and the portable high-precision optical sensing ability is implemented by means of an output mode of a photocurrent.

11 Claims, 5 Drawing Sheets

(51) Int. Cl.
  *H01L 31/0224*  (2006.01)
  *H01L 31/0232*  (2014.01)

(56) References Cited

U.S. PATENT DOCUMENTS

| | | |
|---|---|---|
| 2012/0306042 A1 | 12/2012 | Sou et al. |
| 2013/0020491 A1 | 1/2013 | Mazzillo |
| 2020/0044111 A1* | 2/2020 | Wang .................... H01L 31/119 |

OTHER PUBLICATIONS

Machine Translation of CN 111063752A.*
L. Guyot, et al., Integrated silicon-based nanoplasmonic sensor, Optics Express, May 9, 2011, pp. 9962-9967, vol. 19, No. 10.
M. Perino, et al., Development of a complete plasmonic grating-based sensor and its application for self-assembled monolayer detection, Applied Optics, Sep. 10, 2014, pp. 5969-5976, vol. 53, No. 26.
Arif E Cetin, et al., Handheld high-throughput plasmonic biosensor using computational on-chip imaging, Light: Science & Applications, 2014, pp. 1-10, vol. 3, No. e122.
L. Augel, et al., Plasmonic nanohole arrays on Si—Ge heterostructures: An approach for integrated biosensors, Proc. of SPIE, 2015, pp. 1-7, vol. 9724, No. 97240M.
Hasan Guner, et al., A smartphone based surface plasmon resonance imaging (SPRi) platform for on-site biodetection, Sensors and Actuators B, 2017, pp. 571-577, vol. 239.

* cited by examiner

ELECTRICAL READOUT OPTICAL SENSOR

CROSS REFERENCE TO THE RELATED APPLICATIONS

This application is the national stage entry of International Application No. PCT/CN2018/114869, filed on Nov. 9, 2018 which is based upon and claims priority to Chinese Patent Application No. 201811138819.9, filed on Sep. 28, 2018, the entire contents of which are incorporated herein by reference.

TECHNICAL FIELD

The present invention relates to the research field of sensor technology, in particular to an electrical readout optical sensor.

BACKGROUND

At present, the fields of biomedicine, environmental monitoring, food safety and even national defense all put forward urgent demands for highly sensitive sensors. The optical sensor has the characteristics of high sensitivity, anti-electromagnetic interference, non-marking, etc., so it has received extensive attention and vigorous development. Generally, optical sensors use optical resonance structures to enhance the refractive index sensing performance, and sense the change of the tested object by testing the wavelength shift of the resonance peak. The sensitivity of the sensor is defined as the wavelength shift of the resonance peak when the tested object changes in the unit of refractive index. The greater sensitivity and the smaller line width of the resonance peak are beneficial to achieve a lower detection limit, that is, the better the performance of the sensor. However, in order to obtain these optical signals, a large and expensive spectroscopic analysis system is generally required, which is not conducive to the requirement of portable instant detection. For this reason, electrical readout optical sensors have received extensive attention.

An integrated optical sensor with a metal grating filter of a glass substrate attached to the surface of a silicon detector is reported on Applied Optics, Volume 53, Page 5969, in 2014. The tested object on the surface of the metal grating affects the light transmission characteristics of the filter, thereby changing the incident light signal of the silicon detector therebelow, which in turn affects the output photocurrent of the detector and enables integrated sensing. However, its filter cannot take into account the narrow line width and the high transmittance of the resonance peak, which severely limits the photocurrent output and detection limit of the device. Its operating wavelength range is limited by the photoelectric response band of the silicon detector, which limits the applicable range of the device.

An integrated optical sensor that places a metal nanopore filter on a CMOS image sensor is reported on Light: Science & Applications, Volume 3, No. e122, in 2014, but the sensor is also limited by the defects of a low transmittance, a low photoelectric response rate, a wide resonance line width and a narrow operating wavelength range.

An optical sensor integrated on a smart phone is reported on Sensors and Actuators B, Volume 239, Page 571, in 2017. The optical sensor uses a metal grating to reflect light of a specific wavelength to the camera of the mobile phone. The tested object on the grating affects the resonance wavelength of the reflected light, so as to achieve acquiring optical signals. However, the line width of the resonance reflection is very wide, greatly reducing the contrast of the photoelectric signal, limiting the detection limit of the device, and also only having a narrowband operating wavelength range.

Although these operations have realized the integration of light sensing and light detection to a certain extent, the light sensing components (such as filters) are macroscopically attached or assembled on the surface of the light detector, which limits the further miniaturization of the volume of the device. In addition, this integration method cannot work due to crosstalk between adjacent pixels in the sensing imaging application because the distance between the sensing unit and the detection unit is too large.

An integrated optical sensor with a metal nanopore structure is prepared on the surface of a silicon material covering a silicon oxide layer is reported on Optics Express, Volume 19, Page 9962, in 2011. The tested object on the surface of the nanopore will change the characteristics of transmitted light, thereby affecting the light absorption of the silicon material and the output of the photovoltage signal. This direct integration improves the integration and the stability of the device, and reduces the system noise. However, its operating wavelength is still limited by the transition mechanism between semiconductor bands. The nanopore transmission rate is less than 10%, and the resonance peak line width exceeds 50 nm, which limits the performance of the device. Moreover, the linearity of the optical power and photocurrent of the voltage-type device is poor, which is not conducive to sensing applications.

An integrated optical sensor with a metal nanopore filter directly on the surface of the pin-type GeSi detector is reported on SPIE magazine, Volume 9724, No. 97240M, in 2015. However, its operating wavelength is still limited by the transition mechanism between semiconductor bands. Moreover, the filtering performance of the nanopore is severely disturbed by the large-refractive-index substrate, so that the resonance peak is insignificant, the resonance peak line width exceeds 100 nm, and the detector light absorption rate is less than 50%, which limits the performance of the device.

It can be seen that although all the prior arts represented by the above examples obtain optical sensing of electrical signal output, it is difficult to achieve the coexistence of high sensor sensitivity, narrow resonance peak line width, and large operating wavelength range.

SUMMARY

The object of the present invention is to overcome the shortcomings and deficiencies of the prior art, and to provide an electrical readout optical sensor that realizes an integrated optical refractive index sensor of electrical signal output with high sensor sensitivity, narrow resonance peak line width and large operating wavelength range.

The object of the present invention is achieved by the following technical solutions:

An electrical readout optical sensor, comprising a back metal electrode layer, a semiconductor layer, and a metal or metalloid layer;

wherein the semiconductor layer is a main body portion and is divided into a first surface and a second surface; the first surface is provided with a groove structure, and forms a grating;

the back metal electrode layer covers the second surface of the semiconductor layer;

the metal or metalloid layer covers the first surface of the semiconductor layer, and forms a phototube.

Further, the back metal electrode layer forms an ohmic contact with the second surface of the semiconductor layer.

Further, the metal or metalloid layer forms a Schottky contact with the first surface of the semiconductor layer.

Further, more than one groove is provided on the first surface of the semiconductor layer.

Further, the grooves are arranged at equal intervals.

Further, the semiconductor layer is made of at least one of silicon, germanium, gallium arsenide, gallium nitride, indium phosphide, and a two-dimensional atomic crystal material, or a combination thereof.

Further, the metal or metalloid layer is made of at least one of a metal material and a metalloid two-dimensional atomic crystal material, or a combination thereof; the thickness of the metal or metalloid layer is less than 60 nm.

Further, the metal material comprises gold, silver, copper, aluminum, titanium, nickel, chromium, titanium nitride, zirconium nitride; the metalloid two-dimensional atomic crystal material contains graphene.

Further, the grating is one of a one-dimensional periodic structure and a two-dimensional periodic structure.

Further, the grating period of the grating is 0.2 to 2 times the operating wavelength; the thickness of the grating is 0.02 to 0.2 times the operating wavelength.

Compared with the prior art, the present invention has the following advantages and beneficial effects.

1. The present invention obtains the integration of the optical sensing structure and the photoelectric conversion structure by forming a grating structure on the semiconductor layer and then covered by the metal or metalloid layer, improving the integration and the stability of the device and reducing noise.

2. The present invention obtains the narrowband full absorption optical characteristics through the grating structure covered by the metal or metalloid layer, improving the photocurrent output of the phototube, and ensuring the sensing test accuracy.

3. The present invention obtains the broadband light detection ability in which both photons with energy greater than the semiconductor bandgap and smaller than the semiconductor bandgap are detected based on the inter-band transition and the internal photon emission mechanisms through the direct contact between the semiconductor layer and the metal or metalloid layer, respectively, enlarging the operating wavelength range of the sensor.

In the figures, 1-a semiconductor layer, 2-a metal or metalloid layer, 3-a grating, 4-a back metal electrode layer.

DETAILED DESCRIPTION OF THE EMBODIMENTS

The present invention will be described in further detail hereinafter with reference to embodiments and drawings, but the embodiments of the present invention are not limited thereto.

Embodiments

Figure 1:
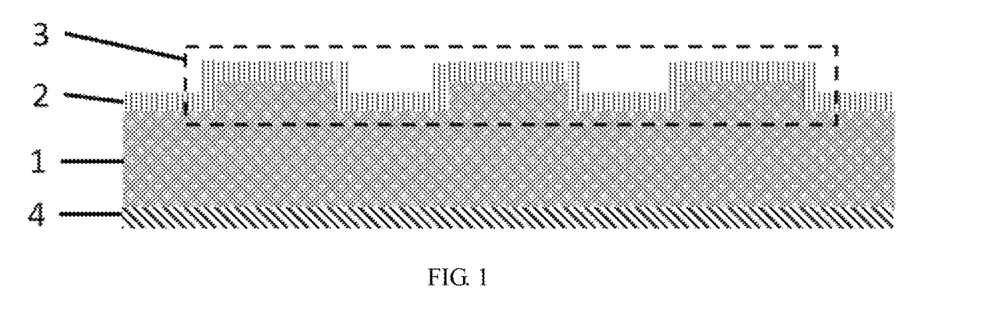
FIG. 1 is a schematic cross-sectional structural diagram of an electrical readout optical sensor according to the present invention.

As shown in FIG. 1, an electrical readout optical sensor comprises a back metal electrode layer 4, a semiconductor layer 1, a metal or metalloid layer 2.

The semiconductor layer is the main body portion, and is made of silicon, which is divided into a first surface and a second surface; the first surface is provided with a groove structure and forms the grating 3.

The grooves are arranged at equal intervals, and more than one groove is provided to form the grating 3; the grating 3 uses a one-dimensional periodic structure with a period of 1 μm, and the width of the protrusions of two adjacent grooves is 0.5 μm, that is, the grating width is 0.5 μm; inevitably, a protrusion is formed between each two adjacent grooves, and then a plurality of protrusions with equal intervals are formed between the plurality of grooves; finally, wires are formed on the metal or metalloid layer 2 and the back metal electrode layer 4, respectively, so as to complete the preparation of the entire sensor.

The back metal electrode layer 4 covers the second surface of the semiconductor layer and forms an ohmic contact with the second surface of the semiconductor layer; the back metal electrode layer 4 is generally made of gold, platinum, aluminum, silver, copper or alloys of these metals.

The metal or metalloid layer covers the first surface of the semiconductor layer and forms a Schottky contact with the first surface of the semiconductor layer to form a Schottky phototube.

Wires are formed on the metal or metalloid layer 2 and the back metal electrode 4, respectively, so as to form an electrical readout optical sensor.

The grating is used to achieve wave vector matching of the incident light with the surface resonance mode of the metal or metalloid layer structure and obtain near-full narrowband light absorption; the first surface of the semiconductor layer forms a Schottky contact with the metal or metalloid layer, the second surface thereof forms an ohmic contact with the back metal electrode, and the whole structure forms a Schottky phototube for generating a photocurrent signal having a wide wavelength range and high linearity.

The metal or metalloid layer material is at least one of a metal material and a metalloid two-dimensional atomic crystal material; the thickness of the metal or metalloid layer is less than 60 nm; the metal material comprises gold, silver, copper, aluminum, titanium, nickel, chromium; the metalloid two-dimensional atomic crystal material contains graphene; the material selected here is gold with a thickness of 50 nm; with this configuration, a part of the incident light is absorbed by the metal or metalloid layer, forming the internal photon emission of the intra-band transition; a part of the transmitted light is absorbed by the semiconductor layer, forming a photoelectric conversion of the inter-band transition.

Figure 2:
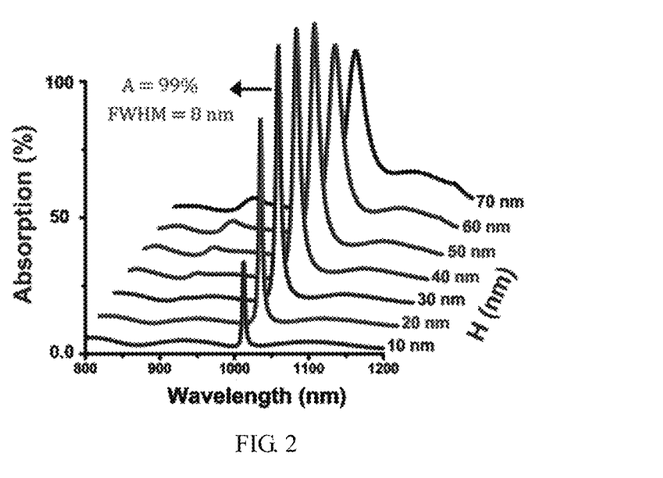
FIG. 2 is a schematic diagram of the calculated absorption spectrum of corresponding different grating thicknesses of an electrical readout optical sensor according to the present invention.

FIG. 2 is a schematic diagram of the calculated absorption spectrum of corresponding different grating thicknesses of an electrical readout optical sensor according to the present invention. There are very narrow resonance peaks in the absorption spectrum. For example, taking a grating height of 30 nm as an example, the center wavelength of the resonance peak is 1010 nm, the half-width FWHM of the resonance peak is 8 nm, which is much smaller than the existing electrical readout optical sensors, and the peak absorption rate reaches 99%, which is much larger than the existing electrical readout optical sensors. These are conducive to improving photoelectric sensor sensitivity. These resonance peaks are surface resonance modes, which occur when the wave vector of the incident light matches the wave vector of the surface resonance mode, and their wavelength and angle are determined by the following formula:

$$k \sin \theta + mG = \pm k_{sp}$$

Where k is the wave vector in the incident light medium environment, $\theta$ is the incident angle, G is the grating vector, m is the diffraction order, and $k_{sp}$ is the wave vector of the surface resonance mode. It can be seen from this formula that when incident at different angles, different-order surface resonance modes occur at different wavelengths.

Figure 3:
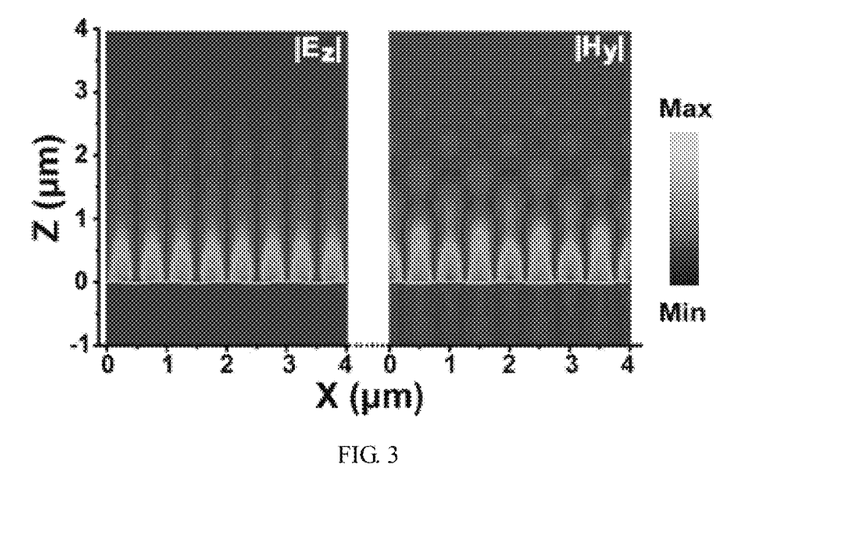
FIG. 3 is a schematic diagram of the calculated electromagnetic field distribution of the surface resonance mode when the corresponding grating thickness of the electrical readout optical sensor is 30 nm according to the present invention.

FIG. 3 is a schematic diagram of the calculated electromagnetic field distribution of the surface resonance mode when the corresponding grating thickness of the electrical readout optical sensor is 30 nm according to the present invention, that is, the spatial distribution of the corresponding electric field and magnetic field at the resonance peak in the sensor profile. It can be seen that the electromagnetic field of the surface resonance mode is localized on the surface of the grating and extends outwards in a limited manner, which is beneficial to interacting with the tested object and realize highly sensitive sensing.

Figure 4:
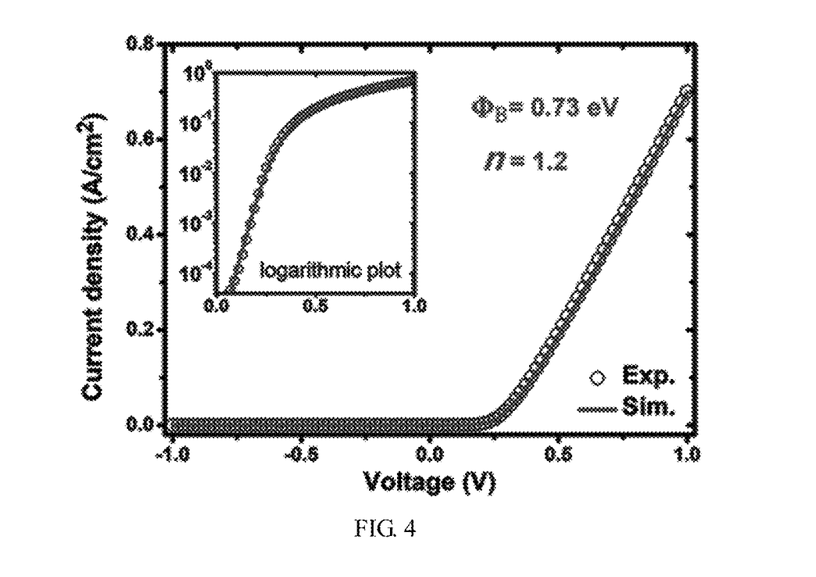
FIG. 4 is a schematic diagram of current density-voltage test results of an electrical readout optical sensor according to the present invention.

FIG. 4 is a schematic diagram of TV test results of an electrical readout optical sensor according to the present invention; obvious rectification characteristics can be seen, and the test results are in good agreement with theoretical simulation results, illustrating the good metal semiconductor Schottky contact of the device.

Figure 5:
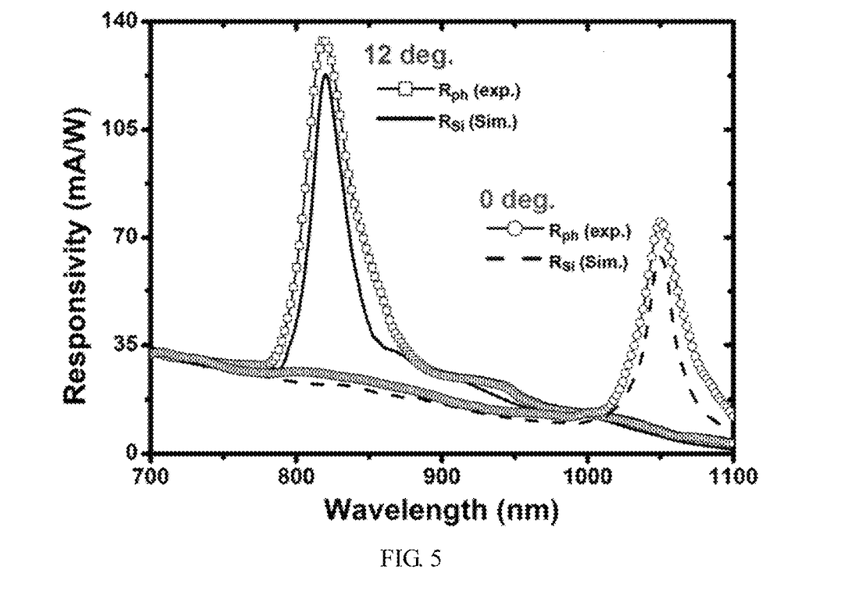
FIG. 5 is a schematic diagram of the test results of the photoelectric response rate corresponding to different incident light angles of the electrical readout optical sensor in the operating band of 700 nm-1100 nm according to the present invention.

FIG. 5 is the test results of the photoelectric responsivity of the electrical readout optical sensor corresponding to different incident light angles in the operating band of 700 nm-1100 nm according to the present invention, specifically, the test results under the incident light irradiation of 0 degree and 12 degree, respectively. The photon energy in this band is greater than the bandgap of the silicon material, so it is the photoelectric detection mechanism dominated by the interband transition. It can be seen that a detection response rate peak is formed at 1050 nm at 0 degree, because the surface resonance mode occurs at 1050 nm when incident at 0 degree, resulting in efficient light absorption; a detection response rate peak is formed at 820 nm at 12 degrees, which also agrees with the wavelength of the surface resonance mode. It can be seen that the detection response rate at 820 nm is close to 140 mA/W, and the detection response rate at 1050 nm exceeds 60 mA/W, reflecting good photoelectric detection performance.

Figure 6:
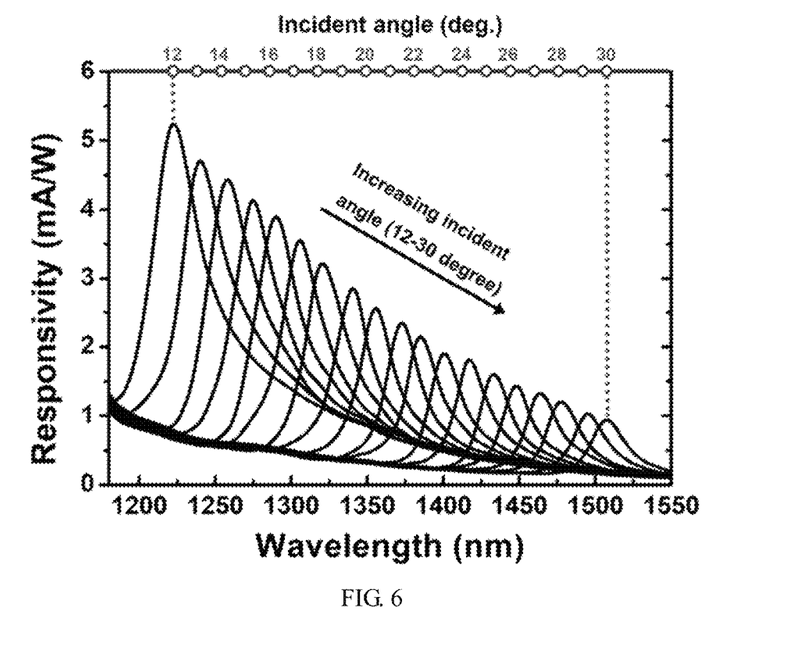
FIG. 6 is a schematic diagram of the test results of the photoelectric response rate corresponding to different incident light angles of the electrical reading optical sensor in the operating band of 1200 nm-1550 nm according to the embodiment of the present invention.

FIG. 6 is a schematic diagram of the test results of the photoelectric responsivity corresponding to different incident light angles of the electrical reading optical sensor in the operating band of 1200 nm-1550 nm according to the embodiment of the present invention, specifically, the test results under the incident light irradiation of 12 degrees to 30 degree. The photon energy in this band is smaller than the bandgap of the silicon material, so it is the photoelectric detection mechanism dominated by the internal photon emission. It can be seen that the detection response rate spectrum peaks at different wavelengths at different angles, which is also determined by the surface resonance mode. The detection wavelength range below the bandgap of the semiconductor layer is a result that has not been exhibited by conventional electrical readout optical detectors.

Figure 7:
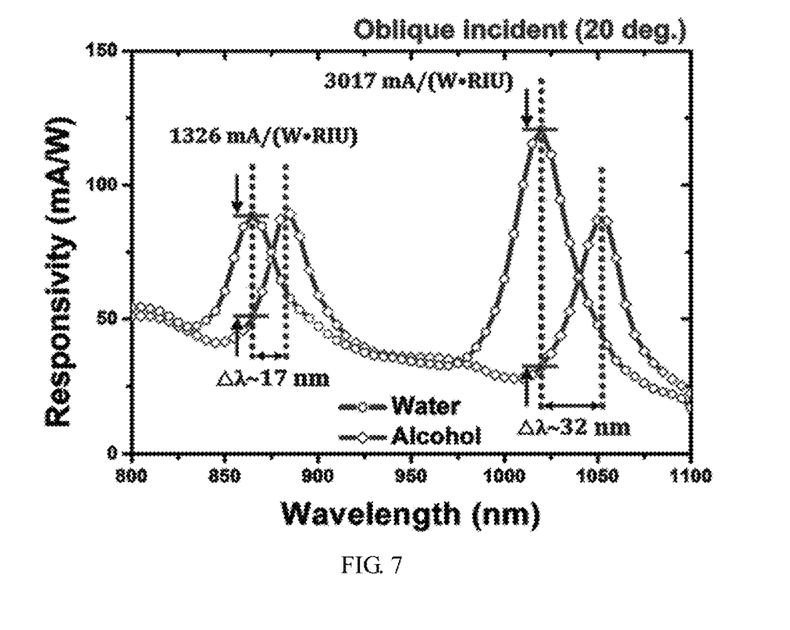
FIG. 7 is a schematic diagram of the test results of the photoelectric response rate spectrum of the electrical readout optical sensor generated when the incident light is irradiated to the two tested objects of water and alcohol from the incident angle direction of 20 degrees according to the embodiment of the present invention.

FIG. 7 is a schematic diagram of the test results of the photoelectric responsivity spectrum of the electrical readout optical sensor generated when the incident light is irradiated to the two tested objects of water and alcohol from the incident angle direction of 20 degrees according to the embodiment of the present invention. It can be seen that for each tested object, the sensor exhibits two peak responses around 870 nm and 1030 nm, which correspond to the second-order and first-order surface resonance modes, respectively. The sensor sensitivity SER of the electrical readout optical sensor is defined as:

$$S_{ER} = R_{ph}/\Delta n$$

Where $R_{ph}$ is the change of the detection response rate, and $\Delta n$ is the change of the refractive index of the tested object.

When the tested object changes from water to alcohol, the two peak responses have a red shift in the peak position of 17 nm and 32 nm, respectively, so as to generate a change in the detection response rate. The corresponding electrical readout sensor sensitivity is 1326 mA/(W·RIU) and 3017 mA/(W·RIU).

Figure 8:
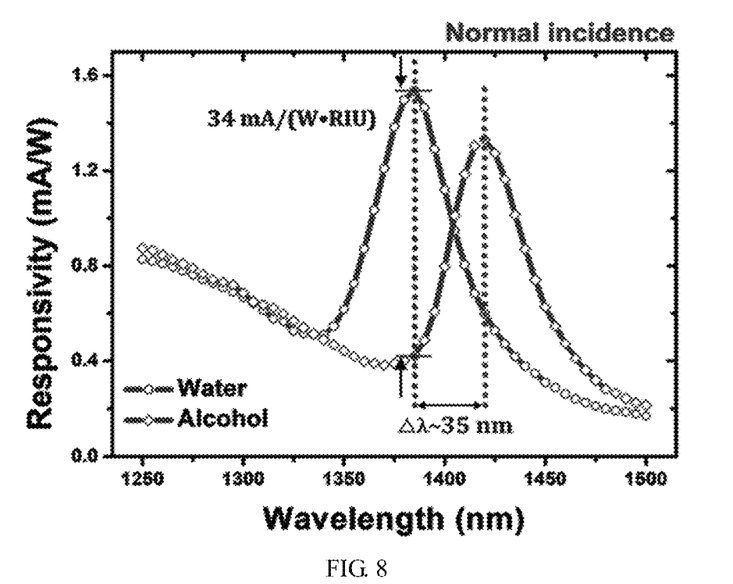
FIG. 8 is a schematic diagram of the test results of the photoelectric response rate spectrum of the electrical readout optical sensor generated when the incident light is irradiated to the two tested objects of water and alcohol from the incident angle direction of 0 degree according to the embodiment of the present invention.

FIG. 8 is a schematic diagram of the test results of the photoelectric response rate spectrum of the electrical readout optical sensor generated when the incident light is irradiated to the two tested objects of water and alcohol from the incident angle direction of 0 degree according to the embodiment of the present invention. It can be seen that for each tested object, the sensor produces a peak response around 1400 nm. After the tested object changes from water to alcohol, the peak position has a red shift of 35 nm, and the corresponding electrical readout sensor sensitivity is 38 mA/(W·RIU), which realizes the sensing of the semiconductor material in the sub-band gap wavelength range.

Figure 9:
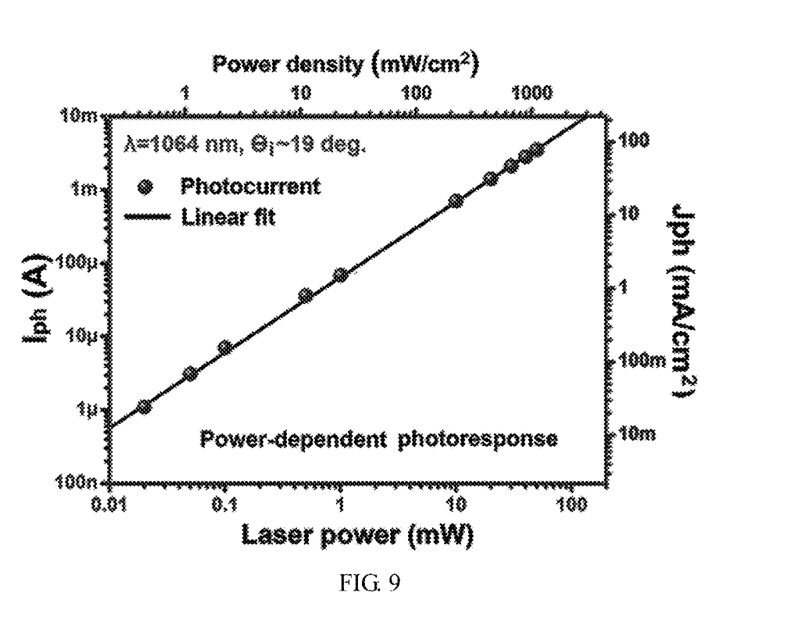
FIG. 9 is a schematic diagram of the relationship that the photocurrent of the electrical readout optical sensor generated when the 1064 nm light is irradiated to the tested object of alcohol from the incident angle direction of 19 degrees changes with the incident optical power according to the embodiment of the present invention.

FIG. 9 is a schematic diagram of the relationship that the photocurrent of the electrical readout optical sensor generated when the 1064 nm light is irradiated to the tested object of alcohol from the incident angle direction of 19 degrees changes with the incident optical power according to the embodiment of the present invention; a very good linear relationship can be seen, which is very important for sensing research, which is also the advantage of the current-type device of the present invention over the voltage-type device.

Figure 10:
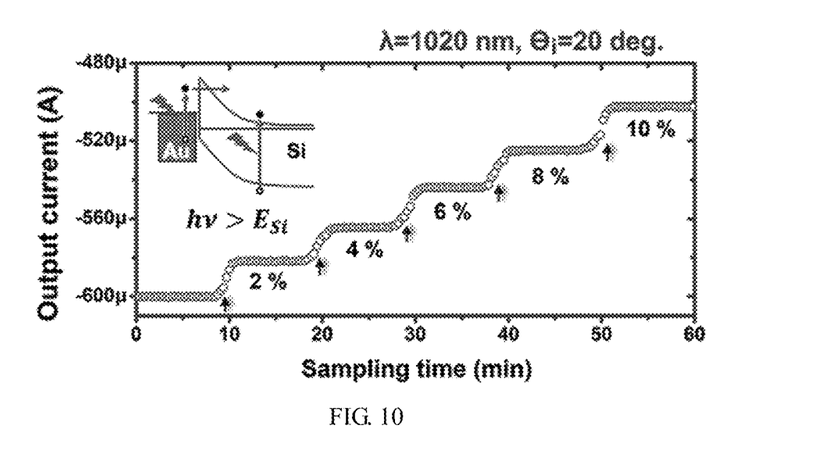
FIG. 10 is a schematic diagram of the photocurrent of the electrical readout optical sensor generated when the 1020 nm light is irradiated to the mixed solution of alcohol and water of different volume ratios from the incident angle direction of 20 degrees according to the embodiment of the present invention.

FIG. 10 is a schematic diagram of the photocurrent of the electrical readout optical sensor generated when the 1020 nm light is irradiated to the mixed solution of alcohol and water of different volume ratios from the incident angle direction of 20 degrees according to the embodiment of the present invention; wherein the photon energy hv of the incident light is greater than the forbidden band width $E_{si}$ of silicon by 1.1 eV, and the incident angle is 20°; during the test, the volume concentration of alcohol is increased by 2% every ten minutes, it can be seen that the 2% concentration difference can be clearly reflected in the output current, so as to achieve the optical sensor detection of the alcohol concentration in an electrical readout manner.

Figure 11:
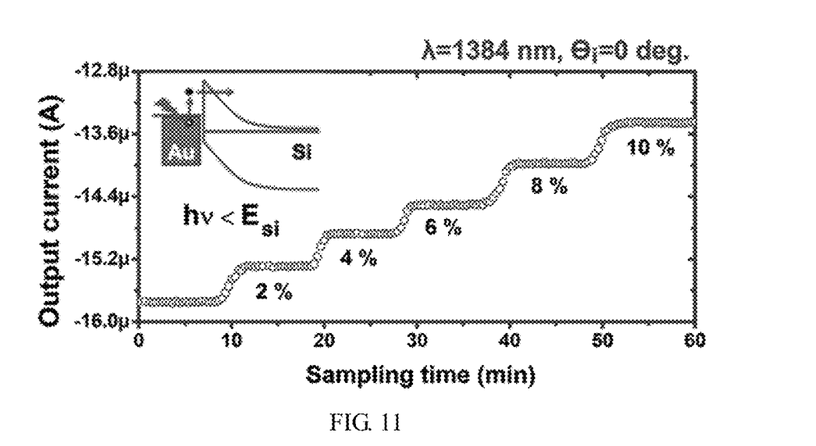
FIG. 11 is a schematic diagram of the photocurrent of the electrical readout optical sensor generated when the 1384 nm light is irradiated to the mixed solution of alcohol and water of different volume ratios from the incident angle direction of 0 degree according to the embodiment of the present invention.

FIG. 11 is a schematic diagram of the photocurrent of the electrical readout optical sensor generated when the 1384 nm light is irradiated to the mixed solution of alcohol and water of different volume ratios from the incident angle direction of 0 degree according to the embodiment of the present invention; wherein the photon energy hv of the incident light is smaller than the forbidden band width $E_{si}$ of silicon by 1.1 eV, and the incident angle is 0°, so as to achieve the optical sensor detection of the alcohol concentration of the silicon material in the sub-band gap wavelength range in an electrical readout manner.

Taking into account that the noise of the source meter used to test the photocurrent is 60 pA, the detecting lower limit of the refractive index change of the prepared sensor is $4.7 \times 10^{-7}$ RIU if a signal to noise ratio larger than 3 is required for detection. This value is much lower than the existing electrical readout optical sensors. All these reflect the advantages of the present invention with high sensitivity, wide operating wavelength range and high integration.

The electrical readout optical sensor of the present invention obtains the surface resonance mode of the narrow line width and high absorption of the light field localized on the surface of the device by forming the semiconductor and the metal or metalloid layer into a phototube and directly integrating with the grating structure, improving the sensitivity to the surface refractive index environment of the device, and enhancing the detection responsivity of the phototube. The Schottky phototube constructed by the semiconductor and the thin metal or metalloid layer can simultaneously realize photoelectric detection with photon energy greater than and less than the semiconductor forbidden band width, increasing the operating wavelength range of the device. In the end, the advantages of high sensitivity, wide operating wavelength range and high integrated electrical readout are simultaneously obtained in the same sensor structure.

The above embodiments are preferred embodiments of the present invention, but the embodiments of the present invention are not limited by the above embodiments. Any other changes, modifications, substitutions, combinations, simplifications, etc., which are made without departing from the spirit and principle of the present invention, should be equivalent replacement methods and be included in the protection scope of the present invention.

What is claimed is:

1. An electrical readout optical sensor, comprising a back metal electrode layer, a semiconductor layer, and a metal or metalloid layer;
    wherein the semiconductor layer is a main body portion and is divided into a first surface and a second surface; the first surface is provided with a groove structure, and forms a grating;
    the back metal electrode layer covers the second surface of the semiconductor layer;
    the metal or metalloid layer covers the first surface of the semiconductor layer, and forms a phototube for generating a photocurrent signal having a wide wavelength range and high linearity; and
    wherein the grating is a one-dimensional periodic structure;
    wherein the metal or metalloid layer is an absorption layer.

2. The electrical readout optical sensor according to claim 1, wherein the back metal electrode layer forms an ohmic contact with the second surface of the semiconductor layer.

3. The electrical readout optical sensor according to claim 1, wherein the metal or metalloid layer forms a Schottky contact with the first surface of the semiconductor layer.

4. The electrical readout optical sensor according to claim 1, wherein a plurality of grooves are provided on the first surface of the semiconductor layer.

5. The electrical readout optical sensor according to claim 4, wherein the plurality of grooves are arranged at equal intervals.

6. The electrical readout optical sensor according to claim 1, wherein the semiconductor layer is made of at least one of silicon, germanium, gallium arsenide, gallium nitride, indium phosphide, and a two-dimensional atomic crystal material.

7. The electrical readout optical sensor according to claim 1, wherein the metal or metalloid layer is made of at least one of a metal material and a metalloid two-dimensional atomic crystal material; and a thickness of the metal or metalloid layer is less than 60 nm.

8. The electrical readout optical sensor according to claim 7, wherein the metal material comprises gold, silver, copper, aluminum, titanium, nickel, chromium, titanium nitride, zirconium nitride; and the metalloid two-dimensional atomic crystal material comprises graphene.

9. The electrical readout optical sensor according to claim 1, wherein a grating period of the grating is 0.2 to 2 times an operating wavelength; and a thickness of the grating is 0.02 to 0.2 times the operating wavelength.

10. The electrical readout optical sensor according to claim 1, wherein a wavelength and angle of an incident light on the sensor are determined by: $k \sin\theta + mG = \pm k_{sp}$,
    where k is a first wave vector of the incident light, $\theta$ is the incident angle, G is a grating vector, m is a diffraction order, and $ks_p$ is a second wave vector of a surface resonance mode.

11. The electrical readout optical sensor according to claim 1, wherein a sensor sensitivity $S_{ER}$ of the electrical readout optical sensor is defined as: $S_{ER}=R_{ph}/\Delta n$, where $R_{ph}$ is a change of a detection response rate, and $\Delta n$ is a change of a refractive index of a tested object.

* * * * *